(12) United States Patent
Homola et al.

(10) Patent No.: US 7,281,920 B2
(45) Date of Patent: Oct. 16, 2007

(54) DIE SET UTILIZING COMPLIANT GASKET

(75) Inventors: Andrew Homola, Morgan Hill, CA (US); Bruce M. Harper, San Jose, CA (US); Christopher H. Bajorek, Los Gatos, CA (US)

(73) Assignee: Komag, Inc., San Jose, CA (US)

( * ) Notice: Subject to any disclaimer, the term of this patent is extended or adjusted under 35 U.S.C. 154(b) by 0 days.

(21) Appl. No.: 11/092,486

(22) Filed: Mar. 28, 2005

(65) Prior Publication Data

US 2006/0216371 A1 Sep. 28, 2006

(51) Int. Cl.
*B29C 43/36* (2006.01)

(52) U.S. Cl. .................. 425/385; 425/405.1; 425/810; 101/16

(58) Field of Classification Search .................. None
See application file for complete search history.

(56) References Cited

U.S. PATENT DOCUMENTS

| | | | |
|---|---|---|---|
| 5,213,600 A | 5/1993 | Greschner et al. | |
| 5,772,905 A | 6/1998 | Chou | |
| 6,165,391 A | 12/2000 | Vedamuttu | |
| 6,482,742 B1 | 11/2002 | Chou | |
| 7,082,876 B2 | 8/2006 | Olsson | |
| 2002/0174556 A1 | 11/2002 | Butler et al. | |
| 2003/0189273 A1* | 10/2003 | Olsson | 264/293 |
| 2004/0149367 A1 | 8/2004 | Olsson et al. | |
| 2005/0146078 A1* | 7/2005 | Chou et al. | 264/293 |
| 2005/0146083 A1 | 7/2005 | Olsson | |
| 2005/0172848 A1 | 8/2005 | Olsson | |
| 2006/0006580 A1 | 1/2006 | Olsson et al. | |

FOREIGN PATENT DOCUMENTS

WO WO 03/090985 11/2003

* cited by examiner

*Primary Examiner*—James P. Mackey
*Assistant Examiner*—Dimple Bodawala
(74) *Attorney, Agent, or Firm*—Blakely, Sokoloff, Taylor & Zafman LLP

(57) ABSTRACT

A die for a press system. The die may include a stamper and a housing, having a cavity disposed therein, coupled to the stamper. The die may also include a gasket disposed within the cavity. The gasket may be coupled to the stamper at a position above a workpiece to be imprinted by the stamper.

26 Claims, 9 Drawing Sheets

DIE SET UTILIZING COMPLIANT GASKET

TECHNICAL FIELD

This invention relates to the field of manufacturing, and more specifically, to a press system.

BACKGROUND

A disk drive system typically has one or more magnetic recording disks and control mechanisms for storing data within approximately circular tracks on a disk. The magnetic recording disk is composed of a substrate and one or more layers deposited on the substrate. A disk substrate may be produced from a blank sheet of, for example, metal-based material such as aluminum or aluminum magnesium. The sheet may be punched to generate a disk substrate having an inner diameter (ID) and an outer diameter (OD). After removing the ID and OD, the disk-shaped substrate may be further processed (e.g., polished, textured, layer deposition, etc.) to produce the magnetic recording disk.

The trend in designing magnetic hard disk drives involves increasing the recording density of a disk drive system. Recording density is a measure of the amount of data that may be stored in a given area of disk. One method for increasing recording densities is to pattern the surface of the disk to form discrete tracks, referred to as discrete track recording (DTR). DTR disks typically have a series of concentric raised zones (a.k.a., lands, elevations, etc.) storing data and recessed zones (a.k.a., troughs, valleys, grooves, etc.) that may store servo information. The recessed zones separate the raised zones to inhibit or prevent the unintended storage of data in the raised zones.

One method of producing DTR magnetic recoding disks includes using a press to imprint embossable films residing on one or both sides of a disk substrate. The press utilizes a die for each side of the disk to be imprinted. The die includes a stamper that is pressed into the embossable film to form the imprinted pattern in the film. The pattern is subsequently transferred to the substrate and/or one or more layers residing above the substrate. Thin film magnetic recording layers are then sputtered over the patterned surface of the substrate to produce the DTR media having a continuous magnetic layer extending over both the raised zones and the recessed zones.

One prior imprinting apparatus described in WO 03/090985, and illustrated in FIG. 1A herein, utilizes stampers 6 and 8 that are sealed to chambers 28 and 30, respectively, utilizing gaskets 32 and 34, respectively. Pressurize air is supplied to the chambers 28 and 30 to generate forces in each chamber that will act simultaneously to press on the stampers 6 and 8. The stampers 6 and 8 are each further provided with a corresponding fluid channel 46 and 48, respectively, to receive pressurized air and holes to eject the air in order to facilitate removal of the stampers 6 and 8 from the substrate 26 after imprinting. One problem with the apparatus described in WO 03/090985 is the chambers 28 and 30 extend over the outer edge of the substrate 26 (with their corresponding gaskets being positioned far from edges of the substrate) without a support structure underneath. The lack of a supporting structure near the outer edge of the substrate 26 between stampers 6 and 8 may result in inconsistent imprinting near the outer portions of substrate 26 relative to other portions of the substrate.

Another prior imprinting apparatus described in U.S. Pat. No. 6,482,742, illustrated in FIG. 1B herein, utilizes a pressure cap 72 having an internal chamber 73 for receiving pressurized fluid. The pressurized fluid within the chamber 73 produces fluid jets through cap openings 71 that press a stamper 10 against an embossable film 21. The cap 72 includes a groove 77, holding an o-ring 78, along a perimeter of the face adjacent to the stamper 10. One problem with the apparatus described in U.S. Pat. No. 6,482,742 is that there is no support structure under the outer edges of stamper 10, which may result in inconsistent imprinting near the outer portions of embossable film 21 relative to other portions of the film.

Another limitation of each of the imprinting apparatus described in WO 03/090985 and U.S. Pat. No. 6,482,742 is that they are designed for use with hole-less substrates such as silicon wafers used in the semiconductor industry. In particular, WO 03/090985 and U.S. Pat. No. 6,482,742 describe sealing arrangements utilizing only outer o-rings or gaskets. Such press apparatus may not be suitable for use with substrates such as magnetic recording disks that have holes. In particular, conventional presses for magnetic recording disks utilize a mandrel, or shaft, having a diameter that is sized to engage the ID of the disk. The dies have a cylindrical opening sized to receive the mandrel. The stampers are disposed around the mandrel and, thus, have an annular shape with an inner diameter (i.e., a hole, or cavity, at their centers). Accordingly, an inner diameter sealing arrangement is required for such press apparatus that is not addressed by WO 03/090985 and U.S. Pat. No. 6,482,742.

BRIEF DESCRIPTION OF THE DRAWINGS

The present invention is illustrated by way of example, and not limitation, in the figures of the accompanying drawings in which.

DETAILED DESCRIPTION

In the following description, numerous specific details are set forth such as examples of specific, components, processes, etc. in order to provide a thorough understanding of various embodiment of the present invention. It will be apparent, however, to one skilled in the art that these specific details need not be employed to practice various embodiments of the present invention. In other instances, well known components or methods have not been described in detail in order to avoid unnecessarily obscuring various embodiments of the present invention.

It should be noted that the apparatus and methods discussed herein may be used with various types of disks. In one embodiment, for example, the apparatus and methods discusses herein may be used with a magnetic recording disk. Alternatively, the apparatus and methods discussed herein may be used with other types of digital recording disks, for example, a compact disk (CD), a digital versatile disk (DVD), and a magneto-optical disk.

Figure 1A:
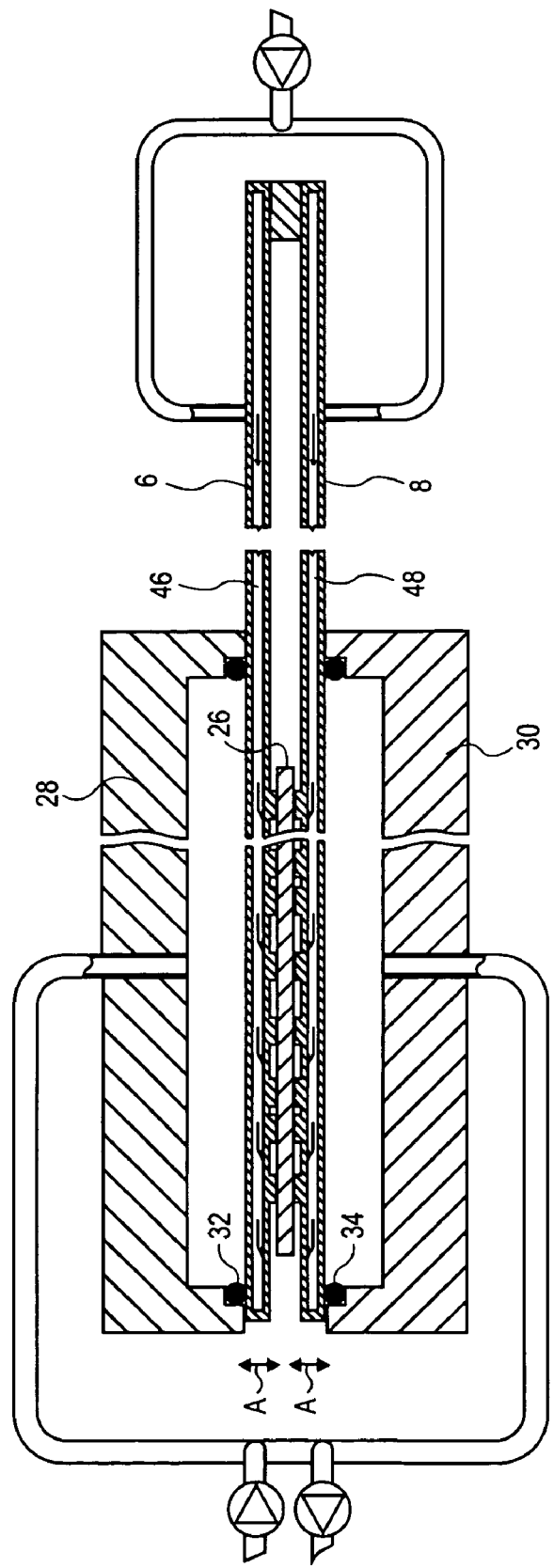
FIG. 1A illustrates a prior press system.
Figure 1B:
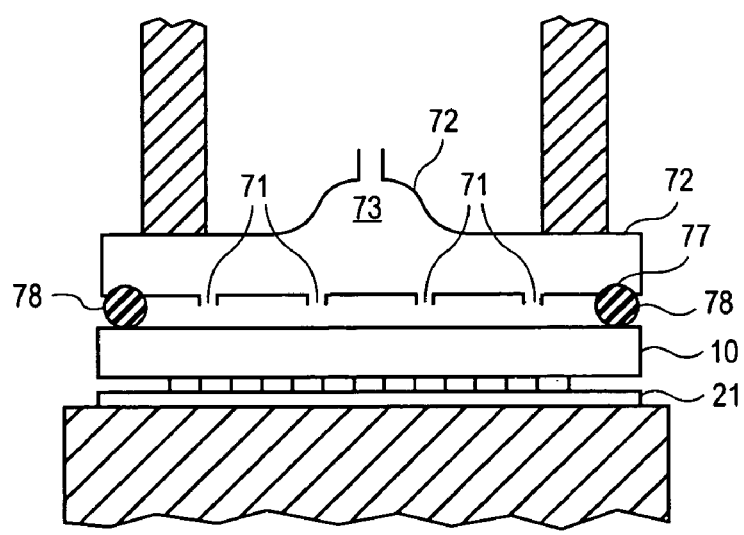
FIG. 1B illustrates another prior press system.
Figure 2:
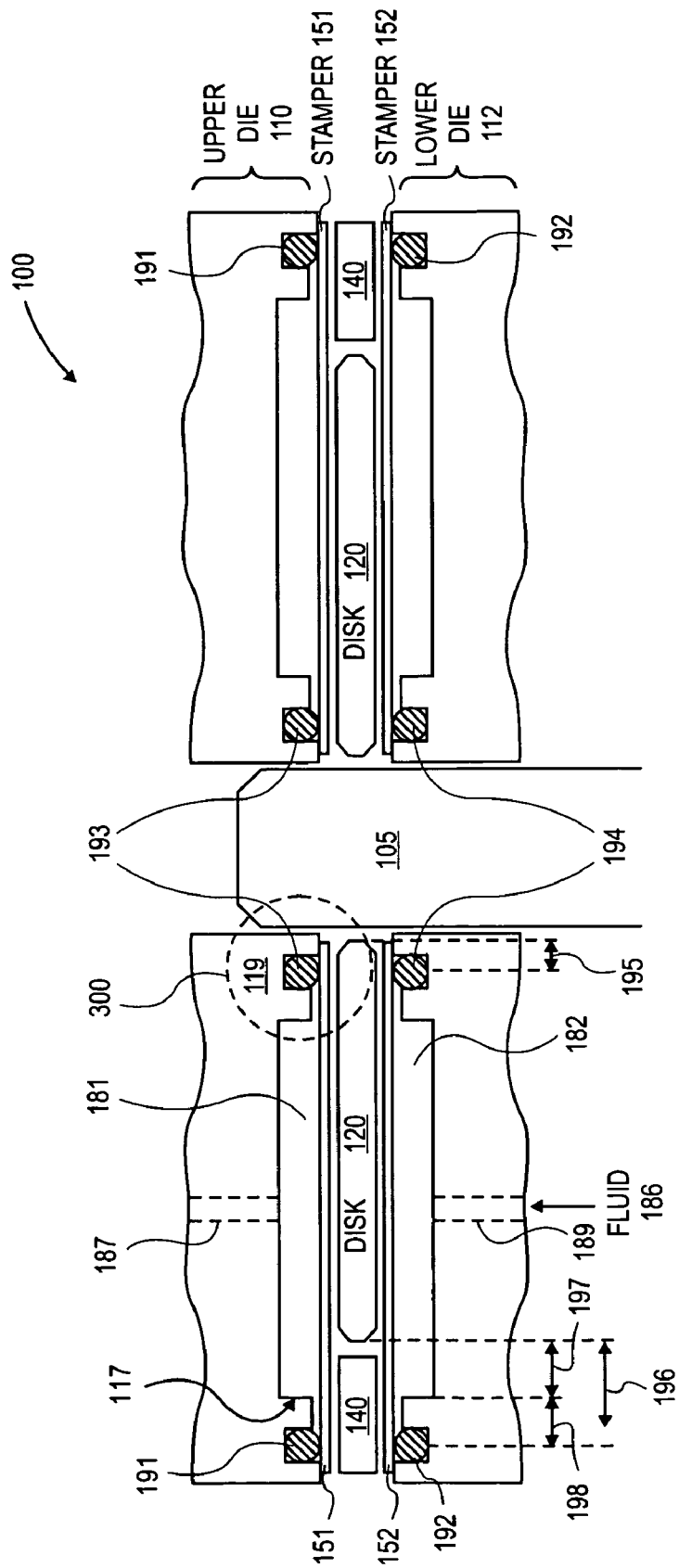
FIG. 2 illustrates a cross section of one embodiment of components of a press system.

FIG. 2 illustrates a cross section of one embodiment of components of a press system. Press system 100 shows a disk 120 disposed between an upper die 110 and a lower die 112 of the press. Disk 120 may be aligned and secured in place on a shaft 105. Disk 120 includes of an embossable film disposed over one or both sides of a base structure that has not been illustrated so as not to obscure an understanding of embodiments of the present invention. In such an embodiment, dimensions of disk 120 and stampers 151 and 152 discussed below may be referred to as diameters (e.g., inner diameter, outer diameter). Although the embodiments of the invention may be discussed in relation to a disk for ease of explanation, the invention is not so limited. In alternative embodiments, disk 120 may be another type of workpiece and have other non-disk shaped (e.g., square, rectangular, etc) dimensions (e.g., perimeters. Furthermore, the stampers discussed herein may be oversized and/or different shaped relative to the size and shape of the disk to be pressed. In alternative embodiments, the stampers may have other shapes and other corresponding dimensions (e.g., widths and lengths).

In this embodiment, stampers 151 and 152 are annularly constructed with a cavity at their approximate centers. The cavity is large enough to accommodate the diameter of shaft 105. A precision punch mechanism may be used to generate the cavity and/or to form the annular stamper out of a sheet of stamper material. Alternatively, the stampers 151 and 152 may be formed using other techniques, for example, electroforming. Stampers 151 and 152 may be constructed of a relatively hard material that may also be rigid, for example, Ni. Alternatively, other hard materials may also be used for the stampers 151 and 152, for example, glass and ceramic. It should be noted that the embossing pattern features of stampers 151 and 152 have not been illustrated in FIG. 2. The press system 100 may also include compliant membranes (not shown) that may either be integrated on the backside of the stampers or separate components that are coupled to the backside of the stampers. The membranes may be constructed from flexible, elastic materials that are hermetically sealed to a die assembly such that a fluid pressure can be applied to their back surface (surface opposite that contacting the stamper) to press the flexible membrane against a stamper, as discussed in further detail below. In one embodiment, the membranes may have a thickness approximately in the range of 10-300 microns. Alternatively, membranes having other thickness may be used. In one embodiment, the membranes may be constructed from a metal (e.g., Ni) or metal alloy (e.g., steel and beryllium copper) material. Alternatively, other materials may be used for the membranes, for example, glass, ceramic, or a composite of materials.

Press system 100 may also utilizes a support member such as an OD ring 140 surrounding disk 120 that may be used to prevent collapse of the stampers 151 and 152 outside the diameter of disk 120 and insure uniform pressing out to the outer diameter of the disk 120. That is, without OD support ring 140, stampers 151 and 152 may not maintain a uniform distance from each other throughout a diameter of disk 120, particularly near its outer diameter. This may result in inconsistent patterning near the outer diameter portions of disk 120 relative to more central portions of disk 120. In one embodiment, support ring 140 may be composed of a metal or metal alloy material. Alternatively, other non-compressable materials may be used.

Referring still to FIG. 2, in this embodiment, the stampers 151 and 152 (or membranes coupled thereto) are sealed in their respective dies 110 and 112, forming cavities 181 and 182, respectively therein. The annular cavities 181 and 182 may be hermetically sealed relative to external ambient pressure using o-ring gaskets. In particular, the cavity 181 is sealed using OD o-ring 191 and ID o-ring 193, and cavity 182 is sealed using OD o-ring 192 and ID o-ring 194. Press system 100 also includes valve-controlled fluid inlets/outlets 187 and 189 for the introduction and removal of a pressurized fluid 186 into cavities 181 and 182. The introduction of pressurized fluid 186 in the cavities 181 and 182 presses (either directly or indirectly via an intervening membrane) the corresponding stampers 151 and 152 into disk 120. The pressurized fluid 186 may be gas or liquid. The fluid may be heated and/or cooled in order to heat and/or cool, respectively, an embossable film residing on disk 120. The fluid may be pressurized, for example, in an approximate range of about 10 to about 5000 psi. Alternatively, other pressures may be used.

In one embodiment, the ID o-ring 194 may be disposed above the ID of the disk 120 at a distance 195 up to approximately 5 millimeters (mm) from the ID edge of disk 120. In one particular embodiment, distance 195 may be approximately 3 mm. In one embodiment, the OD o-ring 191 may be disposed beyond the OD of the disk 120 at approximately a distance 196 up to 5 mm from the OD edge of disk 120. The wall 117 of die housing 119/cavity 181 may be disposed at or beyond the OD edge of disk 120 at a distance 197 approximately in a range of 0 to 5 mm. In one particular embodiment, distance 197 is approximately 2 mm. In one embodiment, distance 198 may be approximately in a range of 1 to 3 mm. It should be noted that o-rings 193 and 194 not only may operate to seal cavities 181, 182 but also may operate to provide compliance of the stampers 151 and 152 at their inner diameters, as discussed below in relation to FIG. 3.

Figure 3A:
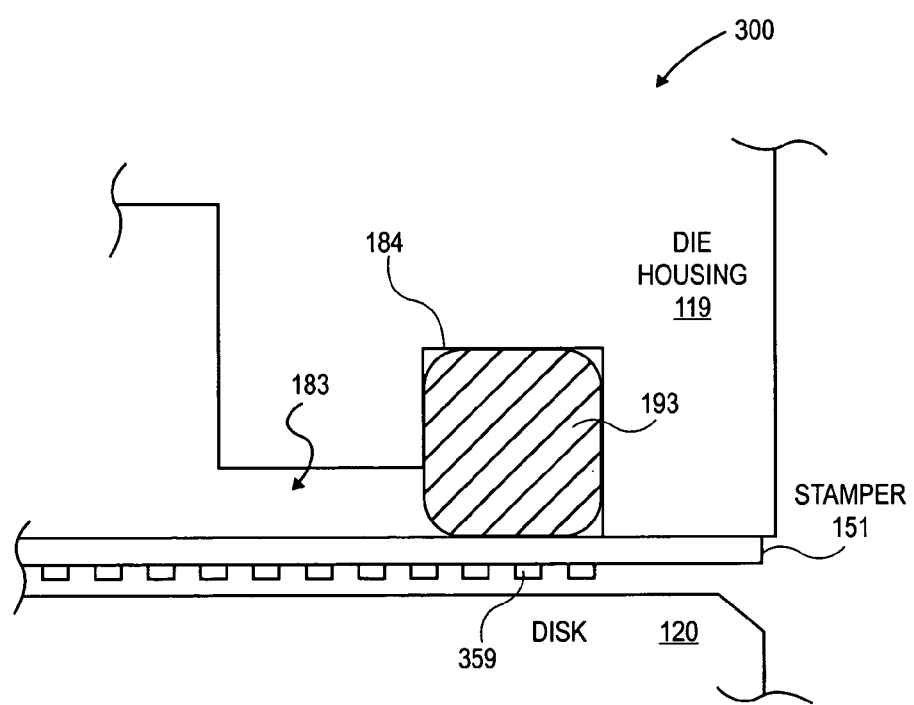
FIG. 3A illustrates a close up cross sectional view of a section of the press system of FIG. 2.
Figure 3B:
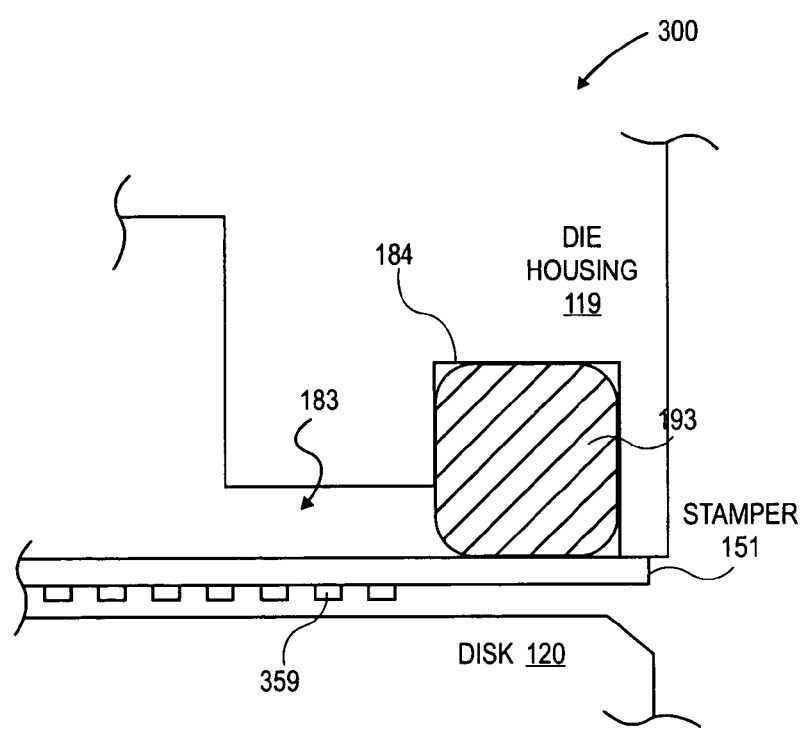
FIG. 3B illustrates an alternative embodiment of components of the press system.

FIG. 3A illustrates a close up cross sectional view of section 300 of FIG. 2. O-ring 193 is retained in die housing 119 within a nook 184 disposed at the end of a narrow channel 183 section of cavity 181. In one embodiment, the o-rings, e.g., o-ring 193, are constructed of an elastic material, for example, rubber that can approximate the viscous characteristics of a fluid. Alternatively, other types of compliant materials may be used for the o-rings, for example, urethanes, teflon and copper. O-ring 194 operates in a manner similar to that discussed above with respect to o-ring 193. In the embodiment illustrated in FIG. 3, the o-ring 193 is disposed above the stamper 151 along a portion of the stamper having embossing pattern features (e.g., pattern feature 359). Alternatively, one or more of the o-rings of FIG. 2 may be disposed above the stampers 151 and 152 along a portion of the stampers not having embossable pattern features, for example, as illustrated in FIG. 3B, or as shown by the position of o-ring 191 in FIG. 2.

Figure 4:
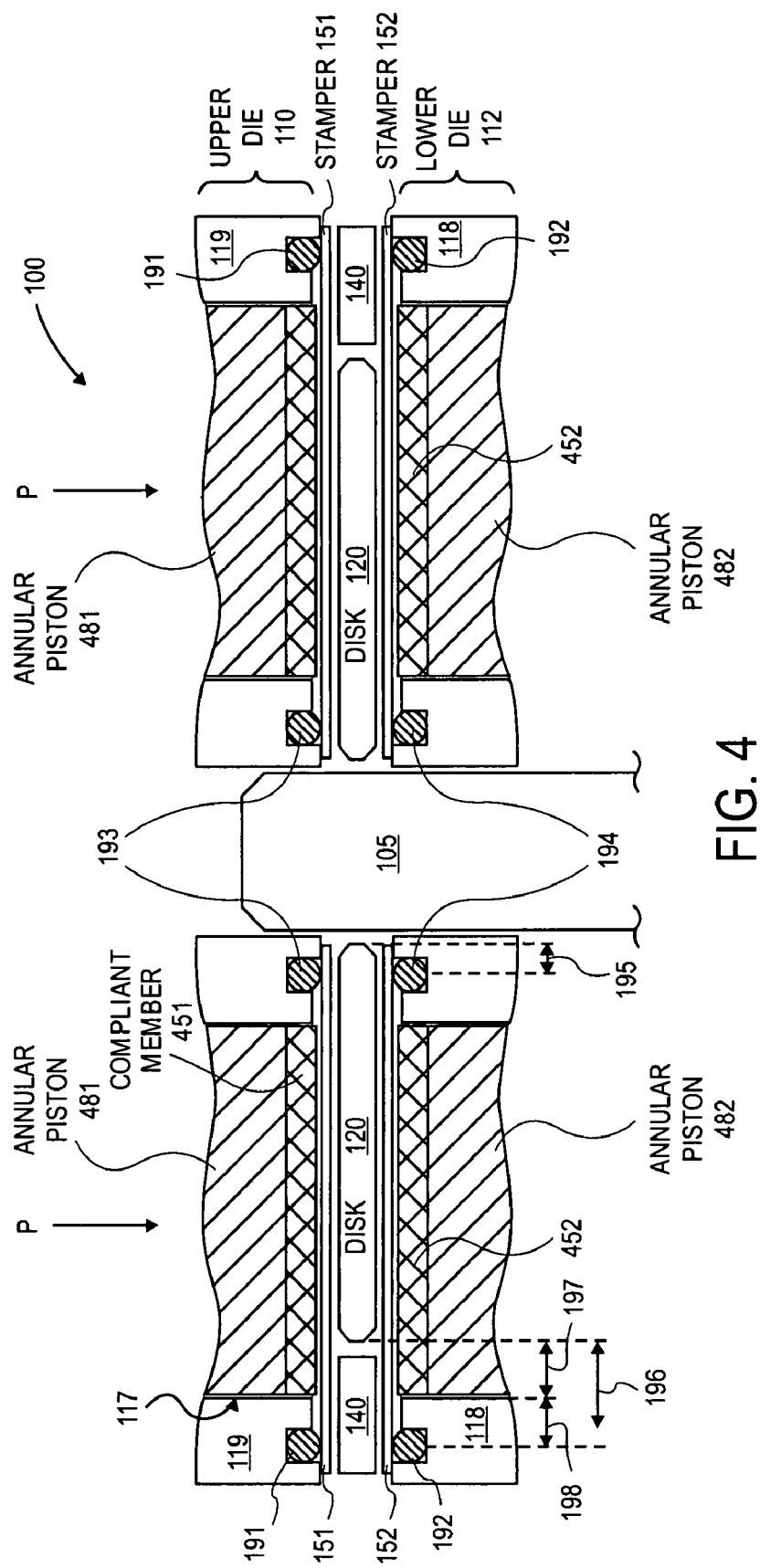
FIG. 4 illustrates an alternative embodiment of a press system utilizing a piston.

FIG. 4 illustrates an alternative embodiment of a press system utilizing a piston. In one embodiment, press system 100 may utilize a piston rather than a pressurize fluid as a means to apply pressure to the stampers 151 and 152. In this embodiment, press system 100 includes annular pistons 481 and 482 that are used to apply pressure P to annular compliant members 451 and 452. The compliant members 451 and 452 need not completely cover stampers 151 and 152. For example, in one embodiment, the compliant members 451 and 452 may be in contact with a portion of the stampers having the embossing pattern features to be imprinted into an embossable film of disk 120. In such an embodiment, the compliant members 451 and 452 may have annular diameters that approximately correspond to the intended data surfaces of a disk 120 being a DTR magnetic recording disk. In such an embodiment, the annular pistons 481 and 482 may have an annular dimension approximately the same as that of the annular compliant members 451 and 452. In such a configuration, pressure is not directly applied on the central regions of stampers 151 and 152 but, rather, indirectly via the compliant members disposed there between.

Compliant members 451 and 452 should preferably be easy to distort under low to moderate pressure, for example, elastic polymer or rubber. In one particular embodiment, the compliant members 451 and 452 may be composed of a silicon elastomer, for example, Sylgard184™ available from Dow Corning Corporation of Mich. In one embodiment, compliant members 451 and 452 may each have a thickness approximately equal to or greater than the thickness of stampers 151 and 152. For example, the thickness of stampers 151 and 152 may be approximately in the range of 1 to 300 microns and the thickness of each of the compliant members 451 and 452 may be approximately in the range of 10 microns to 5 millimeters. The use of compliant members 451 and 452 with a thickness equal to or greater than the thickness of stampers 151 and 152 may assure a more uniform pressure distribution and good compliance during, for example, imprinting of an embossable film of disk 120. It should be noted that although compliant members 451 and 452 may be discussed, at times, in relation to an elastomer, other types of compressible materials may be used. In an alternative embodiment, other types of compliant materials may be used, for example, urethanes and graphites. The particular material selected for use as compliant members 451 and 452 may be based on various factors including but not limited to, for example, its thermal resistance, hardness, and resilience to repeated pressure events.

In this embodiment, compliant members 451 and 452 are constrained from displacing outwardly when pressed against stampers 151 and 152 by solid material of die housings 119 and 118, respectively. The solid material of the die housings prevents outflow of the compliant members that may cause indeterminate grading of pressure at their outer diameters.

O-rings 191-194 may be situated with respect to disk 120 and the die housing inner wall 117 in a manner similar to that described above with respect to FIGS. 2 and 3. In this embodiment, upper die 110 includes an annular stamper 151 coupled with o-rings 191 and 193 such that compliant member 451 is sealed with o-rings 191 and 193 to prevent the escape of particulates from the compliant member 451 toward disk 120 or other critical press system components that may contaminate disk 120 and/or stamper 152. Similarly, lower die 112 may include an annular stamper 152 coupled with o-rings 192 and 194 such that compliant member 452 is sealed with o-rings 192 and 194. It should be noted that, in this embodiment, o-rings 191-194 do not maintain a pressure of the stamper 152 or compliant member 451 but are primarily used as a contamination control barriers. Alternatively, other die configurations may be used such as dies utilizing hole-less stampers. In an alternative embodiment, the compliant members may be integrated with the stampers.

Figure 5:
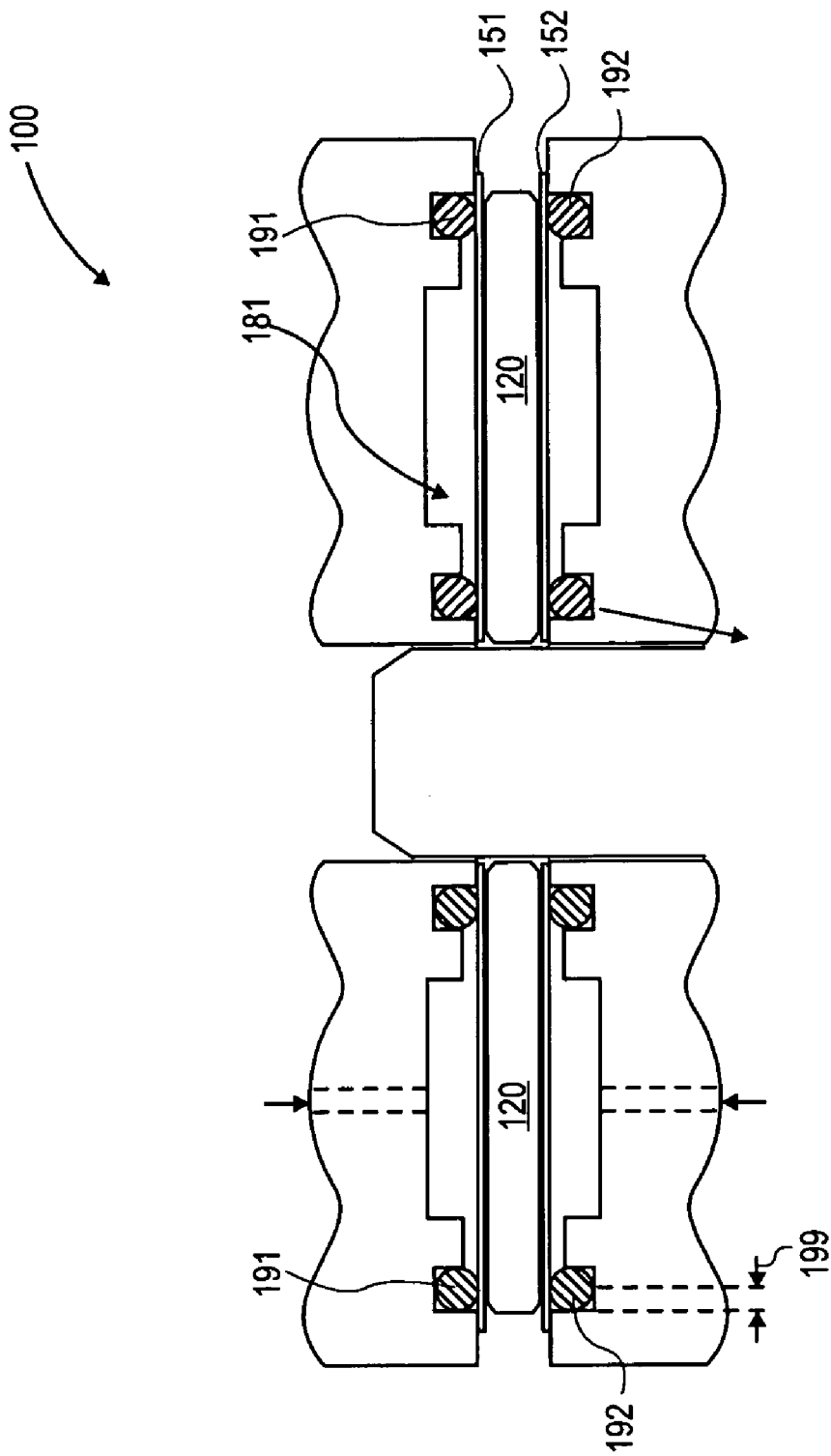
FIG. 5 illustrates yet another embodiment of a press system.

FIG. 5 illustrates an alternative embodiment of a press system. In this embodiment, the outer diameter o-rings 191 and 192 are disposed above the disk 120 at a distance 199 from the OD edge of the disk 120. In one embodiment, distance 199 may be approximately 5 mm from the OD edge of disk 120. In one particular embodiment, distance 199 may be approximately 3 mm. With such a configuration, o-rings 191 and 192 may operate to provide compliance of the stampers 151 and 152 at their outer diameters similar to that discussed above with respect to o-rings 193 and 194 in relation to FIG. 3.

Figure 6:
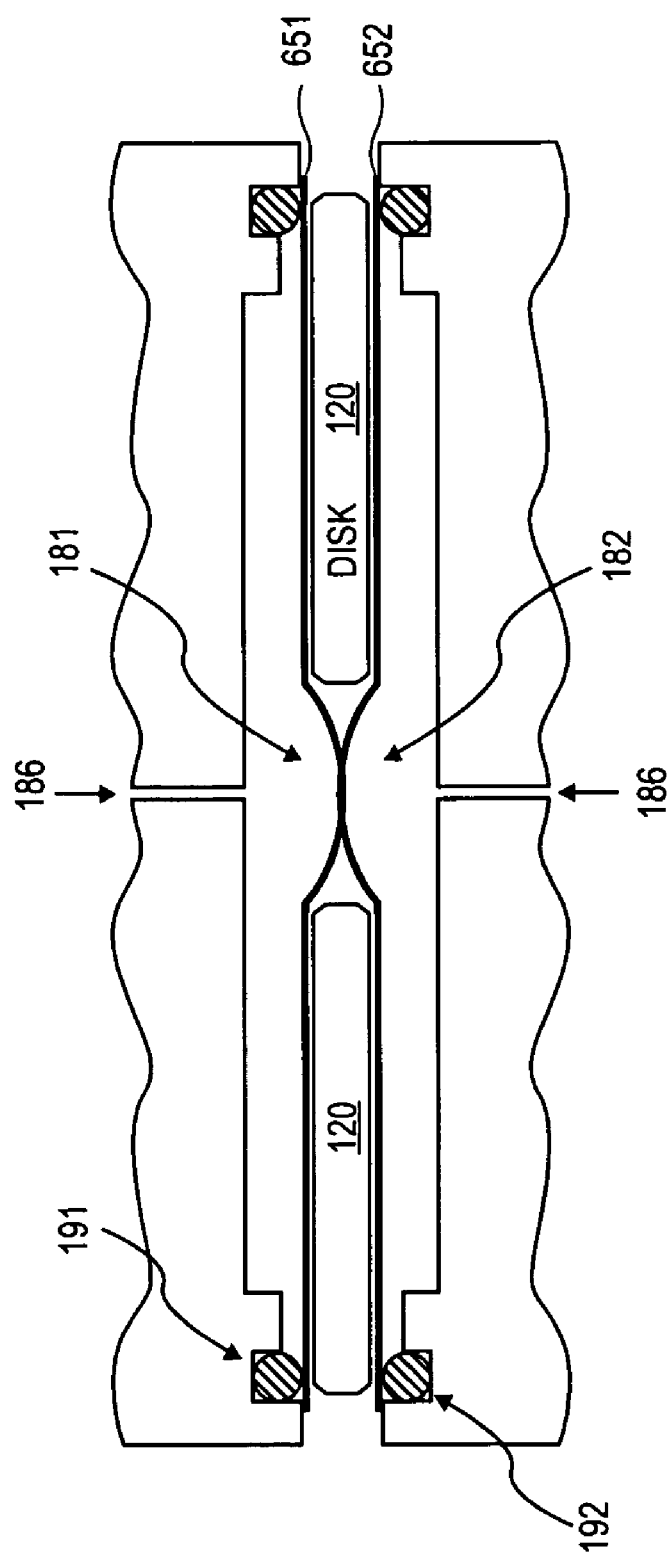
FIG. 6 illustrates another embodiment of a press system utilizing an outer diameter o-ring and a hole-less stamper.

FIG. 6 illustrates another embodiment of a press system utilizing an outer diameter o-ring and a hole-less stamper. In this embodiment, press system 100 utilizes only outer diameter o-rings 191 and 192 without the use of inner diameter o-rings. Inner diameters o-rings are not needed in this configuration because of the use of hole-less stampers 651 and 652. Press system 100 of FIG. 6 utilizes the configuration of FIG. 5, where the outer diameter o-rings 191 and 192 are disposed over disk 120 approximate the disk's OD edge. In this embodiment, the pressurized fluid 186 that is introduced in the cavities 181 and 182 presses (either directly or indirectly via an intervening membrane) the corresponding stampers 651 and 652 along their surfaces disposed over the inner diameter hole of disk 120. Alternatively, the inner diameter hole of disk 120 may be filled with a plug in order to inhibit collapse of stampers 651 and 652 into the inner diameter hole. The plug may be constructed from a hard solid material (e.g., NiP clad aluminum, or glass). In an alternative embodiment, the plug may be constructed from a compliant material, for example, a hard elastomer or a material similar to that used for compliant members 451 and 452. Alternatively, the plug in the inner diameter hole may be substituted with a pressurized fluid.

Figure 7:
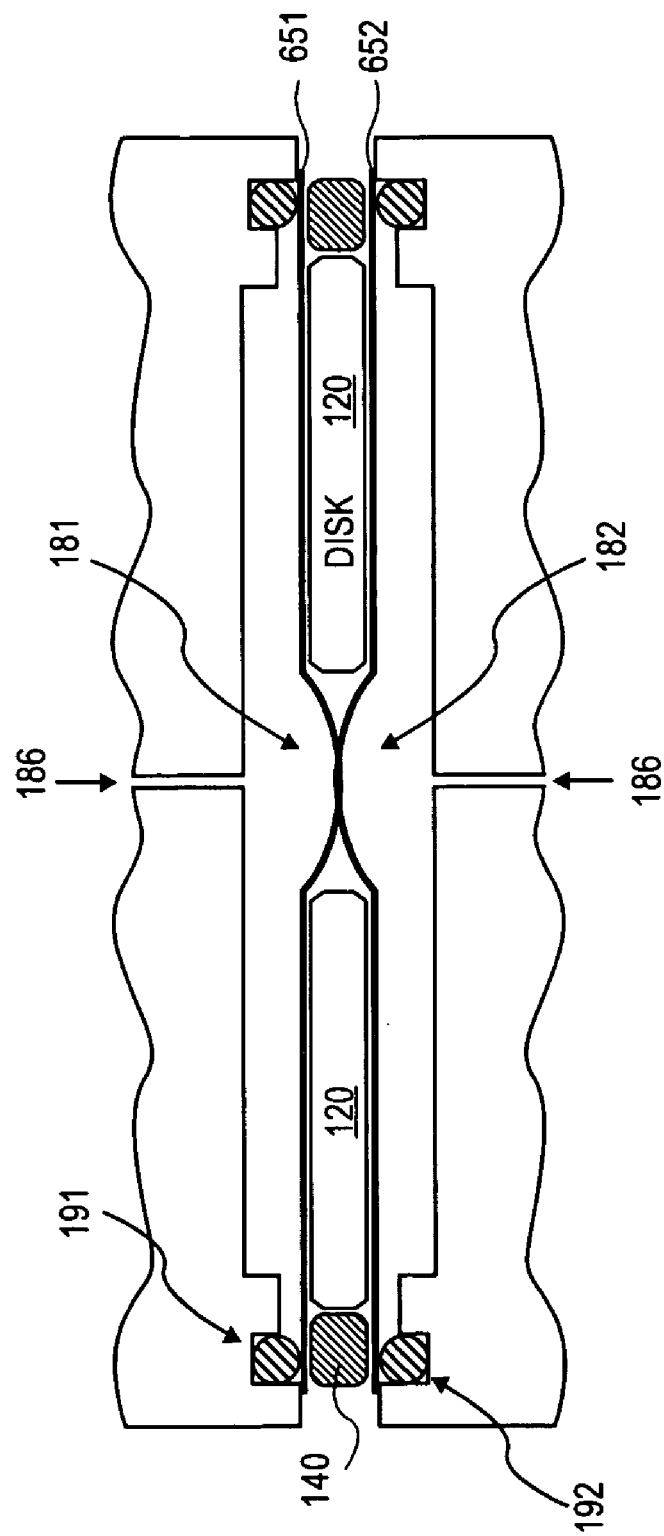
FIG. 7 illustrates an alternative embodiment of a press system utilizing an outer diameter o-ring and a hole-less stamper.

It should be noted that hole-less stampers 651 and 652 may also be used with the o-ring configurations where the outer diameter o-rings are not disposed over disk 120, for example, as illustrated in FIG. 7.

It should also be noted that the press system discussed herein need not be configured for dual side pressing but, rather, may be configured with only a single die for single sided pressing. In a single sided press, the workpiece may be situated on a passive die (i.e., a solid support without an imprinting stamper) to generate an opposite force to that applied with the die on the other side in order to effectuate imprinting. For the embodiment where the press system is configured for dual side pressing, the chuck comprises a die as described above. The above embodiments have been described with exemplary reference to an "o-ring" type gasket only for ease of discussion and illustration. Alternatively, other cross sectional shapes (e.g., oval, square, etc.) and perimeter shapes (e.g., oval, rectangular, etc.) of gaskets may be used. In addition, the above embodiments have been described with exemplary reference to an OD support "ring" only for ease of discussion. Alternatively, support members of other shapes may be used.

The above embodiments have been described with exemplary reference to a "disk" substrate only for ease of discussion. It should be noted that other types and shapes of substrates may be used (e.g., wafer and panel oxide/substrates) having an embossable material disposed thereon. The apparatus and methods discussed herein may be used in applications such as the production of semiconductor devices and liquid crystal display panels. For example, the imprinting apparatus and methods discussed herein may be used to fabricate semiconductor devices (e.g., a transistor). In such a fabrication, an embossable material may be disposed above a base structure of, for example, an oxide (e.g., $SiO_2$) layer on top of a silicon wafer substrate. A stamper may be generated with a patterned structure for active areas of the transistor. The stamper is imprinted into the embossable material with the embossed pattern transferred into the oxide layer using etching techniques (e.g., reactive ion etching). Subsequent semiconductor wafer fabrication techniques well known in the art are used to produce the transistor.

In an alternative embodiment, for example, the imprinting apparatus and methods discussed herein may be used to fabricate pixel arrays for flat panel displays. In such a fabrication, an embossable material may be disposed above a base structure of, for example, an indium tin oxide (ITO) layer on top of a substrate. The stamper is generated with a patterned layer being an inverse of the pixel array pattern. The stamper is imprinted into the embossable material with the embossed pattern transferred into the ITO using etching techniques to pattern the ITO layer. As a result, each pixel of the array is separated by an absence of ITO material (removed by the etching) on the otherwise continuous ITO anode. Subsequent fabrication techniques well known in the art are used to produce the pixel array.

In yet another embodiment, as another example, the imprinting apparatus and methods discussed herein may be used to fabricate lasers. In such a fabrication, embossable material areas patterned by the stamper are used as a mask to define laser cavities for light emitting materials. Subsequent fabrication techniques well known in the art are used to produce the laser. In yet other embodiments, the apparatus and methods discussed herein may be used in other applications, for example, the production of multiple layer electronic packaging, the production of optical communication devices, and contact/transfer printing.

In the foregoing specification, the invention has been described with reference to specific exemplary embodiments thereof. It will, however, be evident that various modifications and changes may be made thereto without departing from the broader spirit and scope of the invention as set forth in the appended claims. The specification and figures are, accordingly, to be regarded in an illustrative rather than a restrictive sense.

What is claimed is:

1. A press system, comprising:
   an upper die and a lower die, at least one of the upper and lower dies comprising:
   a stamper;
   a housing, having a cavity disposed therein, coupled to the stamper;
   a first gasket disposed within the cavity of the housing;
   a second gasket disposed within the cavity of the housing, the second gasket disposed above a position to contain a workpiece to be imprinted by the press system; and
   a support member disposed between the stamper of the at least one of the upper and lower dies and the other one of the dies, the support member configured to reside around an outer perimeter of the workpiece.

2. The press system of claim 1, wherein the second gasket is disposed at a distance in approximately a range of 0 to 5 millimeters from the inner perimeter edge of the workpiece.

3. The press system of claim 2, wherein the distance is approximately 3 mm.

4. The press system of claim 1, further comprising a pressurized fluid disposed within the cavity.

5. The press system of claim 1, wherein the stamper has a hole disposed at its center.

6. The press system of claim 1, wherein the workpiece is a disk and the stamper is an annular stamper.

7. The press system of claim 1, wherein the first gasket is an o-ring and wherein the support member is a support ring.

8. A press system, comprising:
   an upper die and a lower die, at least one of the upper and lower dies comprising:
   a stamper;
   a housing, having a cavity disposed therein, coupled to the stamper;
   a first gasket disposed within the cavity of the housing; and
   a support member disposed between the stamper of the at least one of the upper and lower dies and the other one of the dies, the support member configured to reside around an outer perimeter of a workpiece to be imprinted by the press system, wherein the first gasket is disposed above the support member, wherein the first gasket is disposed at a first distance of approximately 2 millimeters from an outer perimeter edge of the workpiece, wherein the at least one of the upper and lower dies further comprises:
   a second gasket disposed within the cavity of the housing, the second gasket disposed above an inner perimeter edge of the workpiece.

9. The press system of claim 8, wherein the second gasket is disposed at a second distance in approximately a range of 0 to 5 mm from the inner perimeter edge of the workpiece.

10. The press system of claim 9, wherein the second distance is approximately 3 mm.

11. The press system of claim 8, wherein the stamper has an outer perimeter dimension being greater than an outer perimeter dimension of the workpiece.

12. The press system of claim 8, wherein the first and second gaskets are o-rings and wherein the support member is a support ring.

13. The press system of claim 12, where the support member is constructed from a material comprising one of a metal or metal alloy.

14. A press system, comprising:
    an upper die and a lower die, at least one of the upper and lower dies comprising:
    a stamper;
    a housing, having a cavity disposed therein, coupled to the stamper;
    a first gasket disposed within the cavity of the housing;
    a support member disposed between the stamper of the at least one of the upper and lower dies and the other one of the dies, the support member configured to reside around an outer perimeter of a workpiece to be imprinted by the press system;
    a first annular piston disposed within the cavity of the upper die;
    a second annular piston disposed within the cavity of the lower die;
    a first compliant member disposed with the cavity of the upper die;
    a second compliant member disposed within the cavity of the lower die, wherein the first and second annular pistons have an annulus approximately the same as an annulus of the compliant members.

15. A die, comprising:
    a stamper;
    a housing, having an annular cavity disposed therein, coupled to the stamper, the annular cavity having an inner diameter;
    a first gasket disposed within the cavity, the first gasket being disposed approximate the inner diameter of the cavity, the first gasket coupled to the stamper at a position above a workpiece to be imprinted by the stamper; and a second gasket disposed within the cavity, the second gasket being disposed approximate an outer diameter of the cavity.

16. The die of claim 15, wherein the workpiece has a hole disposed at its center.

17. The die of claim 15, further comprising a pressurized fluid disposed in the cavity.

18. The die of claim 15, wherein the first gasket forms an approximate ring having a diameter being less than an outer diameter of the workpiece.

19. The die of claim 15, wherein the first gasket is disposed at a distance in approximately a range of 0 to 5 millimeters from an inner diameter edge of the workpiece.

20. The die of claim 19, wherein the distance is approximately 3 mm.

21. The die of claim 15, wherein the housing is annular having an inner diameter and wherein the first gasket is disposed at a distance in approximately a range of 0 to 5 millimeters from the inner diameter of the annular housing.

22. The die of claim 21, wherein the distance is approximately 3 mm.

23. The die of claim 15, wherein the second gasket coupled to the workpiece at a position above the workpiece to be imprinted by the stamper.

24. The die of claim 15, wherein the second gasket is coupled to the stamper at a position beyond an outer perimeter of the workpiece to be imprinted by the stamper.

25. The die of claim 15, wherein the first gasket is an o-ring and wherein the workpiece is a disk.

26. The die of claim 24, wherein the first and second gaskets are o-rings and wherein the workpiece is a disk.

* * * * *